(12) United States Patent
Han et al.

(10) Patent No.: US 11,231,468 B2
(45) Date of Patent: Jan. 25, 2022

(54) INSPECTION APPARATUS AND INSPECTION METHOD THEREOF

(71) Applicant: Wistron Corp., New Taipei (TW)

(72) Inventors: Chung Kai Han, New Taipei (TW); Yu Shan Huang, New Taipei (TW); Po-Chuan Ku, New Taipei (TW); Chun Yen Tsai, New Taipei (TW)

(73) Assignee: WISTRON CORP., New Taipei (TW)

( * ) Notice: Subject to any disclaimer, the term of this patent is extended or adjusted under 35 U.S.C. 154(b) by 266 days.

(21) Appl. No.: 16/454,002

(22) Filed: Jun. 26, 2019

(65) Prior Publication Data

US 2020/0284848 A1 Sep. 10, 2020

(30) Foreign Application Priority Data

Mar. 7, 2019 (TW) .................................. 108107546

(51) Int. Cl.
*G01R 31/44* (2020.01)

(52) U.S. Cl.
CPC ..................... *G01R 31/44* (2013.01)

(58) Field of Classification Search
CPC .... G01R 31/44; G01R 31/56; G01R 31/2635; G09G 3/006; G02F 1/1309
USPC .......................... 324/750.15, 750.18, 750.24
See application file for complete search history.

(56) References Cited

U.S. PATENT DOCUMENTS

| 5,477,544 | A  | * | 12/1995 | Botelho | G06F 11/221 324/555 |
| 5,994,916 | A  | * | 11/1999 | Hayashi | G09G 3/006 324/760.02 |
| 6,657,648 | B1 | * | 12/2003 | Aoki | G06F 11/2221 345/204 |
| 6,873,174 | B2 | * | 3/2005 | Matsunaga | G09G 3/006 324/760.02 |
| 6,879,056 | B2 | * | 4/2005 | Kemp | G01P 15/125 307/10.1 |
| 6,880,116 | B2 | * | 4/2005 | Man | G01R 31/31905 714/718 |
| 7,015,714 | B2 | * | 3/2006 | Pan | G01R 31/2815 324/73.1 |

(Continued)

FOREIGN PATENT DOCUMENTS

| CN | 1278103 C | 10/2006 |
| CN | 103913461 A1 | 7/2014 |

(Continued)

*Primary Examiner* — Patrick Assouad
*Assistant Examiner* — Sean Curtis

(57) ABSTRACT

Inspection apparatus is provided for inspecting a first electronic device and a second electronic device. The inspection apparatus includes a first signal transfer unit, a second signal transfer unit, a first signal output unit and a second signal output unit. The first signal transfer unit is adapted to receive a first input signal. The second signal transfer unit is adapted to receive a second input signal. The first signal output unit is selectively coupled to the first signal transfer unit or the second signal transfer unit to output a first output signal to inspect the first electronic device. The second signal output unit is selectively coupled to the first signal transfer unit or the second signal transfer unit to output a second output signal to inspect the second electronic device. The inspection apparatus can realize automatic inspection.

8 Claims, 7 Drawing Sheets

(56) References Cited

U.S. PATENT DOCUMENTS

| | | | | |
|---|---|---|---|---|
| 7,129,936 B2 * | 10/2006 | Aoki | | G09G 3/3611 345/204 |
| 7,941,237 B2 * | 5/2011 | Parker | | G02F 1/1309 700/98 |
| RE42,569 E * | 7/2011 | Aoki | | G09G 3/3611 345/204 |
| 8,060,329 B2 * | 11/2011 | Namioka | | G01N 21/95 702/94 |
| 8,400,177 B2 * | 3/2013 | Chiu | | G01R 1/0416 324/760.01 |
| 8,648,609 B2 * | 2/2014 | Shi | | G09G 3/006 324/555 |
| 9,176,004 B2 * | 11/2015 | Yin | | G01J 1/0271 |
| 9,905,144 B2 * | 2/2018 | Lin | | G09G 3/006 |
| 10,068,510 B2 * | 9/2018 | Lee | | G09G 3/006 |
| 10,204,023 B2 * | 2/2019 | Kang | | G02F 1/13454 |
| 10,460,638 B2 * | 10/2019 | Abbott | | G06F 11/2221 |
| 10,546,522 B2 * | 1/2020 | Nakai | | G09G 3/2003 |
| 10,818,262 B2 * | 10/2020 | Sasaki | | G09G 3/006 |
| 2003/0184334 A1 * | 10/2003 | Matsunaga | | G09G 3/006 324/760.02 |
| 2004/0066382 A1 * | 4/2004 | Aoki | | G09G 3/006 345/204 |
| 2007/0205975 A1 * | 9/2007 | Lee | | G09G 3/3611 345/99 |
| 2007/0290708 A1 * | 12/2007 | Takatori | | G01R 31/319 324/750.3 |
| 2008/0125993 A1 * | 5/2008 | Namioka | | G01N 21/95 702/81 |
| 2008/0232939 A1 * | 9/2008 | Parker | | G02F 1/1309 414/225.01 |
| 2009/0160478 A1 * | 6/2009 | Lee | | G09G 3/006 324/760.01 |
| 2010/0318312 A1 * | 12/2010 | Bhat | | G09G 3/006 702/108 |
| 2011/0109322 A1 * | 5/2011 | Shi | | H04N 17/04 324/555 |
| 2013/0242290 A1 * | 9/2013 | Yin | | G01J 1/0271 356/218 |
| 2014/0232424 A1 * | 8/2014 | Richmond, II | | G01R 31/2868 324/750.24 |
| 2017/0083133 A1 * | 3/2017 | Kang | | G02F 1/13454 |
| 2017/0124930 A1 * | 5/2017 | Ortega | | G09G 3/006 |
| 2017/0193872 A1 * | 7/2017 | Lee | | G09G 3/006 |
| 2017/0221403 A1 * | 8/2017 | Nakai | | G06F 3/1423 |
| 2018/0210021 A1 * | 7/2018 | Chang | | G01R 31/2834 |
| 2018/0315363 A1 * | 11/2018 | Abbott | | G09G 5/003 |
| 2020/0035186 A1 * | 1/2020 | Sasaki | | G09G 3/3685 |
| 2020/0152881 A1 * | 5/2020 | Cho | | G01R 31/2601 |
| 2020/0284848 A1 * | 9/2020 | Han | | G01R 31/44 |

FOREIGN PATENT DOCUMENTS

| | | | | |
|---|---|---|---|---|
| CN | 105590572 A | * | 5/2016 | |
| EP | 3188168 A1 | * | 7/2017 | G09G 3/006 |
| KR | 20090023941 A | * | 3/2009 | |
| KR | 20130026793 A | * | 3/2013 | |
| KR | 101284104 B1 | * | 7/2013 | |
| KR | 20150077778 A | * | 7/2015 | |
| KR | 101943416 B1 | * | 4/2019 | |
| KR | 102188448 B1 | * | 12/2020 | |
| WO | WO-2018233067 A1 | * | 12/2018 | G01R 31/28 |

* cited by examiner

INSPECTION APPARATUS AND INSPECTION METHOD THEREOF

CROSS REFERENCE TO RELATED APPLICATIONS

This application claims priority of Taiwan Patent Application No. 108107546, filed on Mar. 7, 2019, the entirety of which is incorporated by reference herein.

BACKGROUND OF THE INVENTION

Field of the Invention

The present invention relates to an inspection apparatus, and in particular to an inspection apparatus with automatic inspection functions.

Description of the Related Art

Conventionally, to inspect displays, an inspector needs to confirm the type of display and manually determine what driving signal source, wire, and signal output connector are required based on the type of display. The inspector bases his judgment on experience, which takes years to cultivate.

BRIEF SUMMARY OF THE INVENTION

In one embodiment, an inspection apparatus is provided. The inspection apparatus is used for inspecting a first electronic device and a second electronic device. The inspection apparatus includes a first signal transfer unit, a second signal transfer unit, a first signal output unit and a second signal output unit. The first signal transfer unit is adapted to receive a first input signal with a first signal input specification. The second signal transfer unit is adapted to receive a second input signal with a second signal input specification, wherein the first signal input specification differs from the second signal input specification. The first signal output unit is selectively coupled to the first signal transfer unit or the second signal transfer unit, wherein the first signal output unit is adapted to be coupled to the first electronic device to output a first output signal with a first signal output specification, and to inspect the first electronic device. The second signal output unit is selectively coupled to the first signal transfer unit or the second signal transfer unit, wherein the second signal output unit is adapted to be coupled to the second electronic device to output a second output signal with a second signal output specification, and to inspect the second electronic device, wherein the first signal output specification differs from the second signal output specification.

In one embodiment, the inspection apparatus further includes a third signal transfer unit, adapted to receive a third input signal with a third signal input specification, wherein the third signal input specification differs from the first signal input specification and the second signal input specification, the first signal output unit is selectively coupled to the first signal transfer unit, the second signal transfer unit or the third signal transfer unit, and the second signal output unit is selectively coupled to the first signal transfer unit, the second signal transfer unit or the third signal transfer unit.

In one embodiment, the inspection apparatus further includes a third signal output unit, wherein the third signal output unit is selectively coupled to the first signal transfer unit or the second signal transfer unit, wherein the third signal output unit is adapted to be coupled to a third electronic device to output a third output signal with a third signal output specification, and to inspect the third electronic device, wherein the third signal output specification differs from the first signal output specification and the second signal output specification.

In one embodiment, the first signal transfer unit includes a first signal transfer board, the second signal transfer unit includes a second signal transfer board, the first signal output unit includes a first signal output board, the second signal output unit includes a second signal output board, the first signal transfer board includes a first transfer board coupling portion, the second signal transfer board includes a second transfer board coupling portion, the first signal output board includes a first output board coupling portion, the second signal output board includes a second output board coupling portion, the first transfer board coupling portion is selectively coupled to the first output board coupling portion or the second output board coupling portion, and the second transfer board coupling portion is selectively coupled to the first output board coupling portion or the second output board coupling portion.

In one embodiment, the inspection apparatus further includes an inspection stage and a moveable stage, wherein the first electronic device and the second electronic device are disposed on the inspection stage, the moveable stage is adapted to be moved in a first direction and a second direction, the first direction is perpendicular to the second direction, the first signal output board and the second signal output board are disposed on the moveable stage, wherein the moveable stage is moved in the first direction to make the first signal output board correspond to the first signal transfer board or the second signal transfer board, or to make the second signal output board correspond to the first signal transfer board or the second signal transfer board, wherein the moveable stage is moved in the second direction to directly couple the first output board coupling portion to the first transfer board coupling portion or the second transfer board coupling portion, or to directly couple the second output board coupling portion to the first transfer board coupling portion or the second transfer board coupling portion, wherein the first signal output board and the second signal output board are adapted to be coupled to the first electronic device or the second electronic device via the inspection stage.

In one embodiment, the inspection apparatus further includes a transfer board, wherein the first signal transfer unit and the second signal transfer unit are disposed on the transfer board, the transfer board includes a first transfer board coupling portion and second transfer board coupling portion, the first signal output unit includes a first signal output board, the second signal output unit includes a second signal output board, the first signal output board includes a first output board coupling portion, the second signal output board includes a second output board coupling portion, the first transfer board coupling portion is selectively coupled to the first output board coupling portion or the second output board coupling portion, the second transfer board coupling portion is selectively coupled to the first output board coupling portion or the second output board coupling portion.

In another embodiment, an inspection apparatus is provided. The inspection apparatus includes an input signal selection unit, a signal distribution circuit, a re-driving circuit, a combining circuit, an output distribution circuit, a first output port and a second output port. The input signal selection unit is adapted to receive a first input signal with a first signal input specification and a second input signal with a second signal input specification, wherein the first signal input specification differs from the second signal input specification, and the input signal selection unit selectively receives the first input signal or the second input signal. The signal distribution circuit is coupled to the input signal selection unit, wherein the signal distribution circuit separates the first input signal or the second input signal into a first difference signal and a touch signal. The re-driving circuit is coupled to the signal distribution circuit, wherein the re-driving circuit re-drives the first difference signal to a second difference signal. The combining circuit is coupled to the signal distribution circuit and the re-driving circuit, wherein the combining circuit combines the touch signal and the second difference signal into an output signal. The output distribution circuit is coupled to the combining circuit. The output distribution circuit is coupled to the first output port and the second output port, and selectively outputs the output signal to the first output port or the second output port, the first output port has a first signal output specification, the second output port has a second signal output specification, and the first signal output specification differs from the second signal output specification.

In another embodiment, an inspection method for inspecting a display is provided. The inspection method includes the following steps. First, the inspection apparatus mentioned above is provided. Next, the serial number of the display is read. Then, according to the serial number, corresponding inspection information is transmitted to the inspection apparatus. Next, the inspection apparatus is coupled to the display, and inspects the display.

In one embodiment, the inspection apparatus further includes an optical inspection module.

In one embodiment, the inspection method further includes the following steps. First, the appearance of the display is inspected using the optical inspection module, while the display is not lit. Then, the display is lit. Next, defects of the display are inspected using the optical inspection module while the display is lit.

Utilizing the inspection apparatus of the embodiment of the invention, the inspection apparatus can choose the corresponding driving signal source according to the type of the electronic devices automatically, and can provide the output signal matching the interface specification of the electronic device. Therefore, the electronic devices can be inspected automatically, and the problem wherein there is a lack of experienced inspectors can be circumvented.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
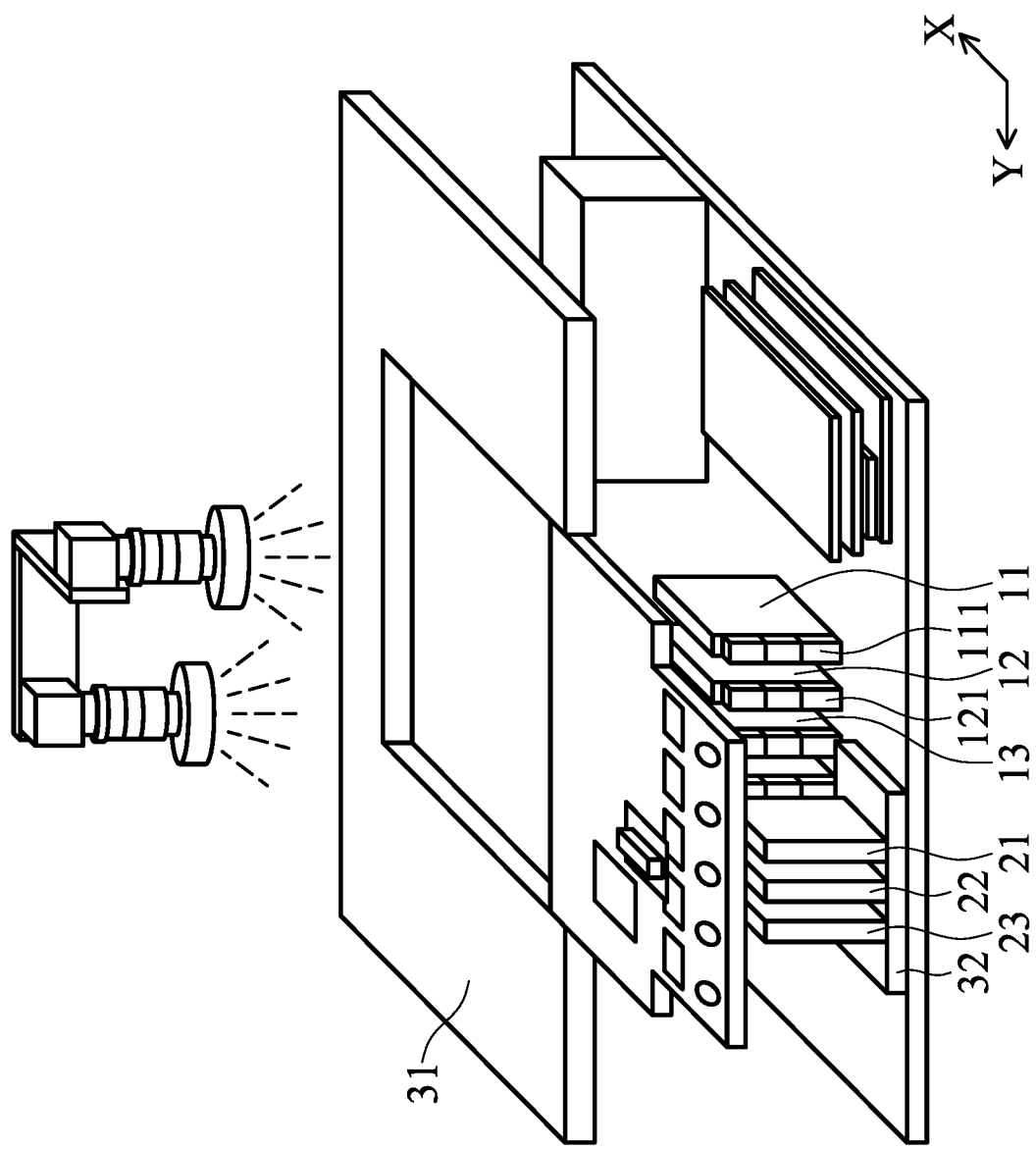
FIG. 1 shows inspection apparatus of a first embodiment of the invention.
Figure 2A:
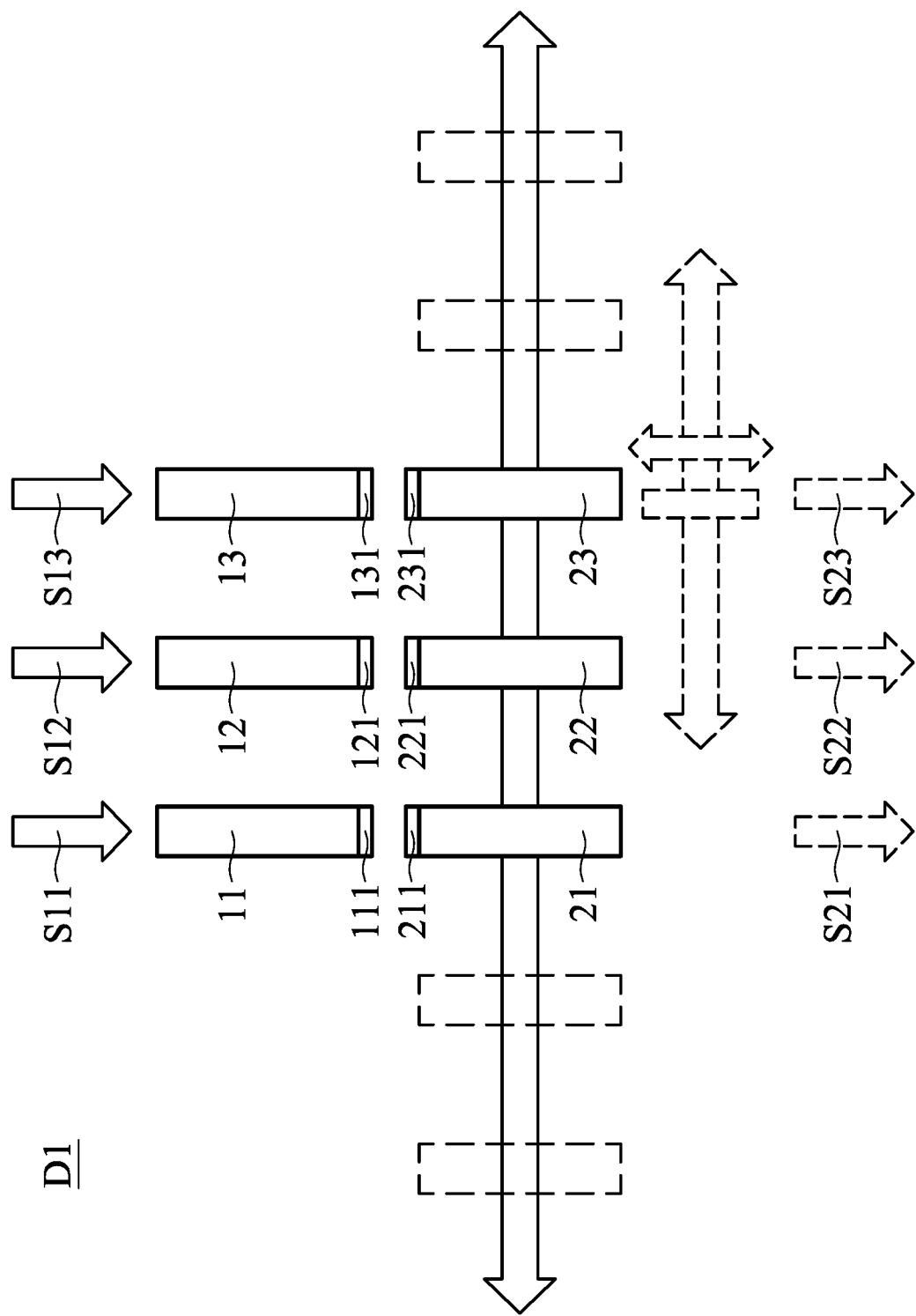
FIG. 2A shows the main elements of the inspection apparatus of the first embodiment of the invention.
Figure 2B:
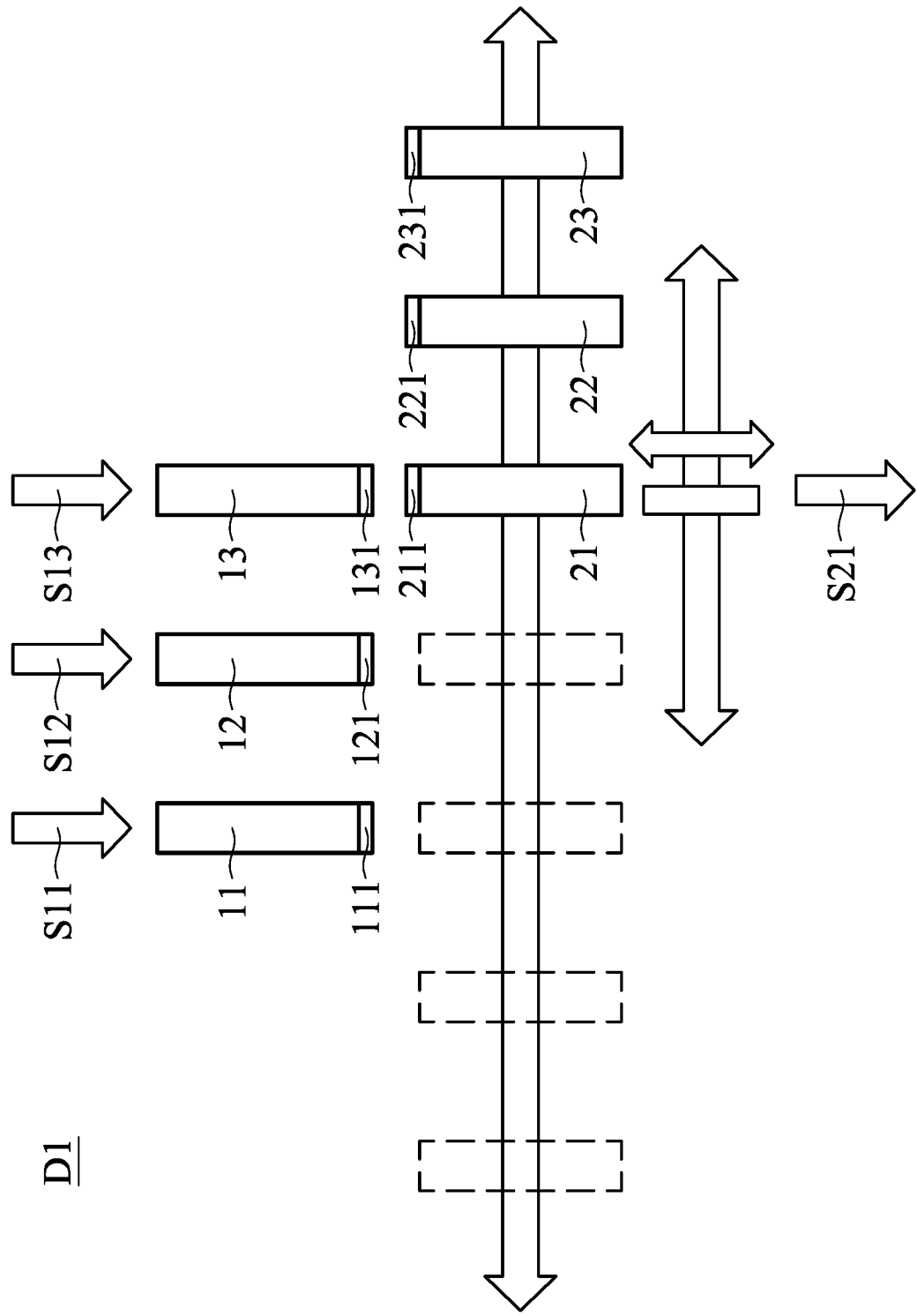
FIG. 2B shows the operation of the inspection apparatus of the first embodiment of the invention.

FIG. 1 shows an inspection apparatus D1 of a first embodiment of the invention. The inspection apparatus D1 is for inspecting a first electronic device (not shown) and a second electronic device (not shown) with different inspection interface specification. The inspection apparatus D1 includes a first signal transfer unit 11, a second signal transfer unit 12, a first signal output unit 21 and a second signal output unit 22. FIGS. 2A and 2B show the main elements of the inspection apparatus D1 of the first embodiment of the invention. With reference to FIGS. 1, 2A and 2B, the first signal transfer unit 11 is adapted to receive a first input signal S11 with a first signal input specification. The second signal transfer unit 12 is adapted to receive a second input signal S12 with a second signal input specification, wherein the first signal input specification differs from the second signal input specification. The first signal output unit 21 is selectively coupled to the first signal transfer unit 11 or the second signal transfer unit 12. The first signal output unit 21 is adapted to be coupled to the first electronic device to output a first output signal S21 with a first signal output specification, and to inspect the first electronic device. The second signal output unit 22 is selectively coupled to the first signal transfer unit 11 or the second signal transfer unit 12. The second signal output unit 22 is adapted to be coupled to the second electronic device to output a second output signal S22 with a second signal output specification, and to inspect the second electronic device. The first signal output specification differs from the second signal output specification.

With reference to FIGS. 1, 2A and 2B, in one embodiment, the inspection apparatus D1 further includes a third signal transfer unit 13 which is adapted to receive a third input signal S13 with a third signal input specification. The third signal input specification differs from the first signal input specification and the second signal input specification. The first signal output unit 21 is selectively coupled to the first signal transfer unit 11, the second signal transfer unit 12 or the third signal transfer unit 13. The second signal output unit 22 is selectively coupled to the first signal transfer unit 11, the second signal transfer unit 12 or the third signal transfer unit 13.

With reference to FIGS. 1, 2A and 2B, in one embodiment, the inspection apparatus further includes a third signal output unit 23. The third signal output unit 23 is selectively coupled to the first signal transfer unit 11, the second signal transfer unit 12 or the signal transfer unit 13. The third signal output unit 23 is adapted to be coupled to a third electronic device to output a third output signal S23 with a third signal output specification, and to inspect the third electronic device. The third signal output specification differs from the first signal output specification and the second signal output specification.

In FIG. 2B, the first signal output unit 21 is coupled to the signal transfer unit 13 to transfer the third input signal S13 into the first output signal S21.

In the embodiments of the invention, the number of the signal transfer units and the number of the signal output units can be modified. The disclosure is not meant to restrict the invention.

With reference to FIGS. 1, 2A and 2B, in the following description, the relationship between the first signal transfer unit 11, the second signal transfer unit 12, the first signal output unit 21 and the second signal output unit 22 are described as an example. In one embodiment, the first signal transfer unit 11 is a first signal transfer board. The second signal transfer unit 12 is a second signal transfer board. The first signal output unit 21 is a first signal output board. The second signal output unit 22 is a second signal output board. The first signal transfer board 11 includes a first transfer board coupling portion 111. The second signal transfer board 12 includes a second transfer board coupling portion 121. The first signal output board 21 includes a first output board coupling portion 211. The second signal output board 22 includes a second output board coupling portion 221. The first transfer board coupling portion 111 is selectively coupled to the first output board coupling portion 211 or the second output board coupling portion 221. The second transfer board coupling portion 121 is selectively coupled to the first output board coupling portion 211 or the second output board coupling portion 221.

With reference to FIGS. 1, 2A and 2B, in one embodiment of the invention, a third signal transfer board (the third signal transfer unit) 13 includes a third transfer board coupling portion 131. A third signal output board (the third signal output unit) 23 includes a third output board coupling portion 231. The third transfer board coupling portion 131 is selectively coupled to the first output board coupling portion 211, the second output board coupling portion 221 or the third output board coupling portion 231.

In the embodiments above, the output board coupling portions can be coupled to the transfer board coupling portions via POGO pins. The disclosure is not meant to restrict the invention.

With reference to FIGS. 1, 2A and 2B, in the following description, the relationship between the first signal transfer unit 11, the second signal transfer unit 12, the first signal output unit 21 and the second signal output unit 22 are described as an example. In one embodiment, the inspection apparatus further includes an inspection stage 31 and a moveable stage 32. The first electronic device and the second electronic device are disposed on the inspection stage 31. The moveable stage 32 is adapted to be moved in a first direction X and a second direction Y. The first direction X is perpendicular to the second direction Y. The first signal output board 21 and the second signal output board 22 are disposed on the moveable stage 32. The moveable stage 32 is moved in the first direction X to make the first signal output board 21 correspond to the first signal transfer board 11 or the second signal transfer board 12, or to make the second signal output board 22 correspond to the first signal transfer board 11 or the second signal transfer board 12. The moveable stage 32 is moved in the second direction Y to directly couple the first output board coupling portion 211 to the first transfer board coupling portion 111 or the second transfer board coupling portion 121, or to directly couple the second output board coupling portion 221 to the first transfer board coupling portion 111 or the second transfer board coupling portion 121. The first signal output board 21 and the second signal output board 22 are adapted to be coupled to the first electronic device or the second electronic device via the inspection stage 31.

Figure 3:
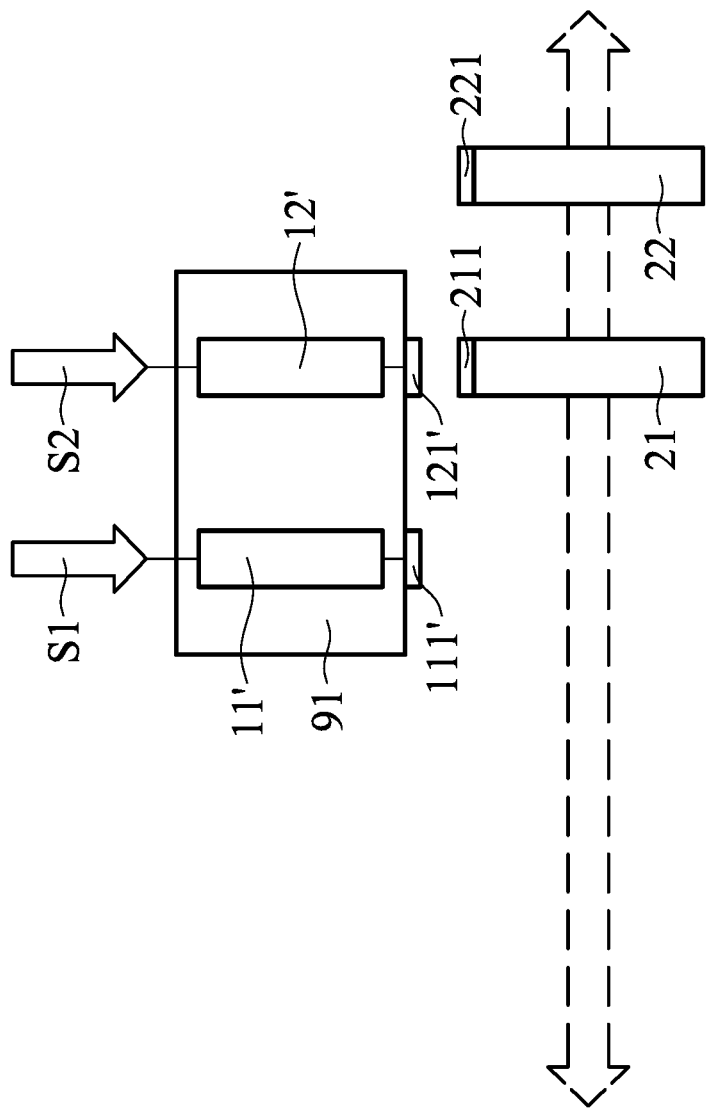
FIG. 3 shows inspection apparatus of a modified example of the invention.

With reference to FIG. 3, in another embodiment, the inspection apparatus further includes a transfer board 91. The first signal transfer unit 11' and the second signal transfer unit 12' are disposed on the transfer board 91. The transfer board 91 includes a first transfer board coupling portion 111' and second transfer board coupling portion 121'. The first signal output unit 21 is a first signal output board. The second signal output unit 22 is a second signal output board. The first signal output board 21 includes a first output board coupling portion 211. The second signal output board 22 includes a second output board coupling portion 221. The first transfer board coupling portion 111' is selectively coupled to the first output board coupling portion 211 or the second output board coupling portion 221. The second transfer board coupling portion 121' is selectively coupled to the first output board coupling portion 211 or the second output board coupling portion 221.

Figure 4:
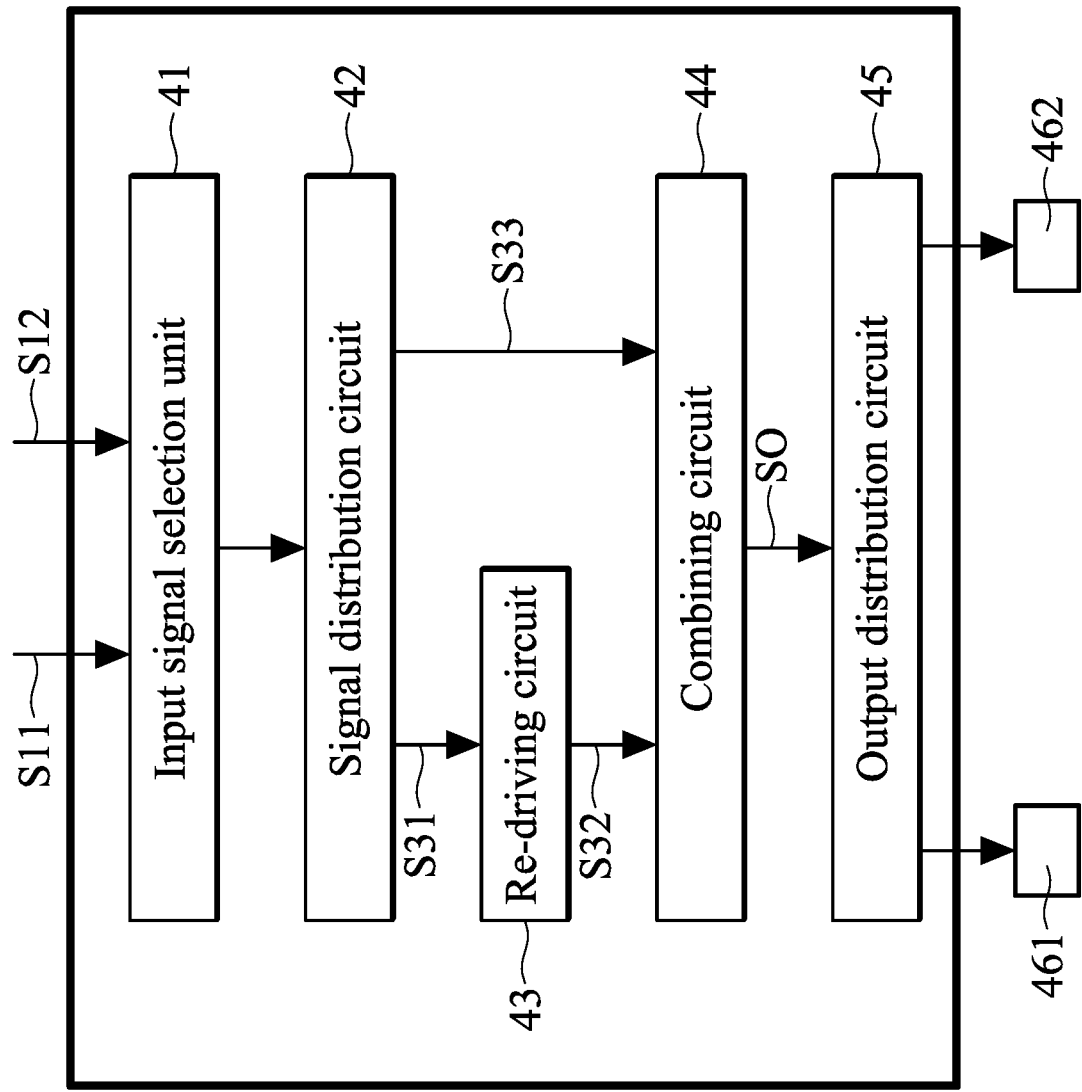
FIG. 4 shows the main elements of the inspection apparatus of a second embodiment of the invention.

With reference to FIG. 4, in a second embodiment of the invention, another inspection apparatus D2 is provided. The inspection apparatus D2 includes an input signal selection unit 41, a signal distribution circuit 42, a re-driving circuit 43, a combining circuit 44, an output distribution circuit 45, a first output port 461 and a second output port 462. The input signal selection unit 41 is adapted to receive a first input signal S11 with a first signal input specification and a second input signal S12 with a second signal input specification. The first signal input specification differs from the second signal input specification. The input signal selection unit 41 selectively receives the first input signal S11 or the second input signal S12. The signal distribution circuit 42 is coupled to the input signal selection unit 41, wherein the signal distribution circuit 42 separates the first input signal S11 or the second input signal S12 into a first difference signal S31 and a touch signal S33. The re-driving circuit 43 is coupled to the signal distribution circuit 42, wherein the re-driving circuit 43 re-drives the first difference signal S31 to a second difference signal S32. The combining circuit 44 is coupled to the signal distribution circuit 42 and the re-driving circuit 43, wherein the combining circuit 44 combines the touch signal S33 and the second difference signal S32 into an output signal SO. The output distribution circuit 45 is coupled to the combining circuit 44. The output distribution circuit 45 is coupled to the first output port 461 and the second output port 462, and selectively outputs the output signal SO to the first output port 461 or the second output port 462. The first output port 461 has a first signal output specification. The second output port 462 has a second signal output specification. The first signal output specification differs from the second signal output specification.

Figure 5A:
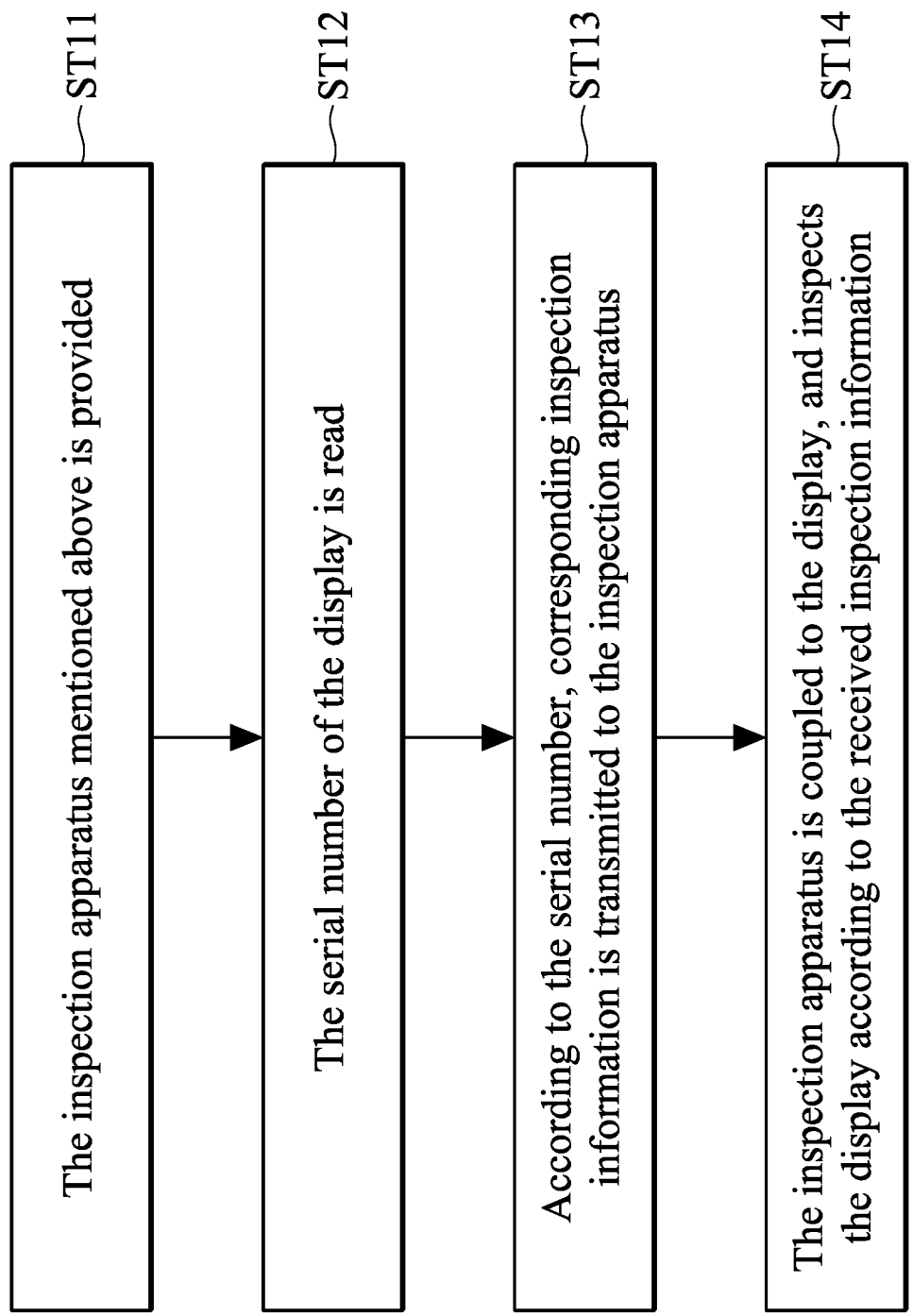
FIGS. 5A and 5B show an inspection method of an embodiment of the invention.

With reference to FIG. 5A, in one embodiment, an inspection method for inspecting a display is provided. The inspection method includes the following steps. First, the inspection apparatus mentioned above is provided (ST11). Next, the serial number of the display is read (ST12). Then, according to the serial number, corresponding inspection information is transmitted to the inspection apparatus (ST13). Next, the inspection apparatus is coupled to the display, and inspects the display according to the received inspection information (ST14).

In one embodiment, the inspection apparatus further includes an optical inspection module.

Figure 5B:
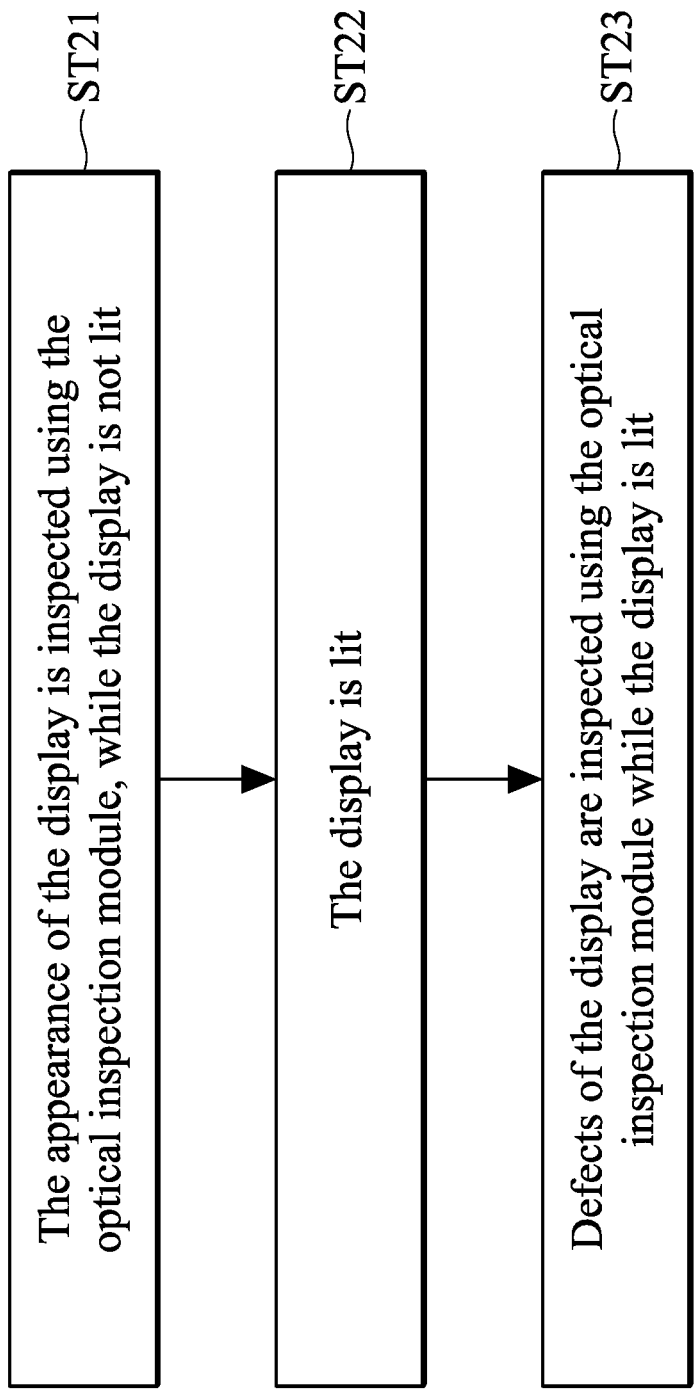

With reference to FIG. 5B, in one embodiment, the inspection method further includes the following steps. First, the appearance of the display is inspected using the optical inspection module, while the display is not lit (ST21). Then, the display is lit (ST22). Next, defects of the display are inspected using the optical inspection module while the display is lit (ST23).

In the embodiments above, the input signals can include the EDP (Embedded Display Port) signal, the LVDS (Low Voltage Differential Signaling) signal, and the touch signal. The output signal can include the pattern generator output signal and the mainboard output signal. In one embodiment, the specifications of the input signals can be the following three groups:

I-Pex LVDS, Coax 30pin
ACES eDP, FPC 40pin
FOXCONN LVDS, Coax 30pin

In one embodiment, the specifications of the output signals can be the following three groups:

I-Pex LVDS, Coax 30pin
I-Pex LVDS, Coax 40pin
I-Pex LVDS, Coax 50pin

The disclosure is not meant to restrict the invention.

Utilizing the inspection apparatus of the embodiment of the invention, the inspection apparatus can choose the corresponding driving signal source according to the type of the electronic devices automatically, and can provide the output signal matching the interface specification of the electronic device. Therefore, the electronic devices can be inspected automatically, and the problem wherein there is a lack of experienced inspectors can be circumvented.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An inspection apparatus, for inspecting a first electronic device and a second electronic device, comprising:
    a first signal transfer unit, adapted to receive a first input signal with a first signal input specification;
    a second signal transfer unit, adapted to receive a second input signal with a second signal input specification, wherein the first signal input specification differs from the second signal input specification;
    a first signal output unit, wherein the first signal output unit is selectively coupled to the first signal transfer unit or the second signal transfer unit, wherein the first signal output unit is adapted to be coupled to the first electronic device to output a first output signal with a first signal output specification, and to inspect the first electronic device; and
    a second signal output unit, wherein the second signal output unit is selectively coupled to the first signal transfer unit or the second signal transfer unit, wherein the second signal output unit is adapted to be coupled to the second electronic device to output a second output signal with a second signal output specification, and to inspect the second electronic device, wherein the first signal output specification differs from the second signal output specification,
    wherein the first signal transfer unit comprises a first signal transfer board, the second signal transfer unit comprises a second signal transfer board, the first signal output unit comprises a first signal output board, the second signal output unit comprises a second signal output board, the first signal transfer board comprises a first transfer board coupling portion, the second signal transfer board comprises a second transfer board coupling portion, the first signal output board comprises a first output board coupling portion, the second signal output board comprises a second output board coupling portion, the first transfer board coupling portion is selectively coupled to the first output board coupling portion or the second output board coupling portion, and the second transfer board coupling portion is selectively coupled to the first output board coupling portion or the second output board coupling portion.

2. The inspection apparatus as claimed in claim 1, further comprising a third signal transfer unit, adapted to receive a third input signal with a third signal input specification, wherein the third signal input specification differs from the first signal input specification and the second signal input specification, the first signal output unit is selectively coupled to the first signal transfer unit, the second signal transfer unit or the third signal transfer unit, and the second signal output unit is selectively coupled to the first signal transfer unit, the second signal transfer unit or the third signal transfer unit.

3. The inspection apparatus as claimed in claim 1, further comprising a third signal output unit, wherein the third signal output unit is selectively coupled to the first signal transfer unit or the second signal transfer unit, wherein the third signal output unit is adapted to be coupled to a third electronic device to output a third output signal with a third signal output specification, and to inspect the third electronic device, wherein the third signal output specification differs from the first signal output specification and the second signal output specification.

4. The inspection apparatus as claimed in claim 1, further comprising an inspection stage and a moveable stage, wherein the first electronic device and the second electronic device are disposed on the inspection stage, the moveable stage is adapted to be moved in a first direction and a second direction, the first direction is perpendicular to the second direction, the first signal output board and the second signal output board are disposed on the moveable stage, wherein the moveable stage is moved in the first direction to make the first signal output board correspond to the first signal transfer board or the second signal transfer board, or to make the second signal output board correspond to the first signal transfer board or the second signal transfer board, wherein the moveable stage is moved in the second direction to directly couple the first output board coupling portion to the first transfer board coupling portion or the second transfer board coupling portion, or to directly couple the second output board coupling portion to the first transfer board coupling portion or the second transfer board coupling portion, wherein the first signal output board and the second signal output board are adapted to be coupled to the first electronic device or the second electronic device via the inspection stage.

5. An inspection apparatus, for inspecting a first electronic device and a second electronic device, comprising:

a first signal transfer unit, adapted to receive a first input signal with a first signal input specification;

a second signal transfer unit, adapted to receive a second input signal with a second signal input specification, wherein the first signal input specification differs from the second signal input specification;

a first signal output unit, wherein the first signal output unit is selectively coupled to the first signal transfer unit or the second signal transfer unit, wherein the first signal output unit is adapted to be coupled to the first electronic device to output a first output signal with a first signal output specification, and to inspect the first electronic device; and a second signal output unit, wherein the second signal output unit is selectively coupled to the first signal transfer unit or the second signal transfer unit, wherein the second signal output unit is adapted to be coupled to the second electronic device to output a second output signal with a second signal output specification, and to inspect the second electronic device, wherein the first signal output specification differs from the second signal output specification, a transfer board, wherein the first signal transfer unit and the second signal transfer unit are disposed on the transfer board, the transfer board comprises a first transfer board coupling portion and second transfer board coupling portion, the first signal output unit comprises a first signal output board, the second signal output unit comprises a second signal output board, the first signal output board comprises a first output board coupling portion, the second signal output board comprises a second output board coupling portion, the first transfer board coupling portion is selectively coupled to the first output board coupling portion or the second output board coupling portion, the second transfer board coupling portion is selectively coupled to the first output board coupling portion or the second output board coupling portion.

6. An inspection method, for inspecting a display, comprising:
providing an inspection apparatus as claimed in claim 1;
reading a serial number of the display;
according to the serial number, transmitting corresponding inspection information to the inspection apparatus; and
coupling the inspection apparatus to the display, and inspecting the display.

7. The inspection method as claimed in claim 6, wherein the inspection apparatus further comprises an optical inspection module.

8. The inspection method as claimed in claim 7, further comprising:
inspecting an appearance of the display with the optical inspection module, while the display is not lit;
lighting up the display; and
inspecting defects of the display with the optical inspection module while the display is lit.

\* \* \* \* \*